(12) United States Patent
Choi et al.

(10) Patent No.: US 9,159,946 B2
(45) Date of Patent: Oct. 13, 2015

(54) ORGANIC LIGHT EMITTING DIODE DISPLAY HAVING AUXILIARY ELECTRODE

(71) Applicant: Samsung Display Co., Ltd., Yongin, Gyeonggi-Do (KR)

(72) Inventors: Jin Baek Choi, Anyang-si (KR); Hyun Sung Bang, Bucheon-si (KR); Yeon Hwa Lee, Yongin-si (KR); Joon Gu Lee, Seoul (KR); Ji Young Choung, Yongin-si (KR); Young Woo Song, Suwon-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/205,088

(22) Filed: Mar. 11, 2014

(65) Prior Publication Data

US 2015/0102294 A1  Apr. 16, 2015

(30) Foreign Application Priority Data

Oct. 15, 2013  (KR) .......................... 10-2013-0122831

(51) Int. Cl.
*H01L 51/52* (2006.01)
*H01L 51/56* (2006.01)
*H01L 27/32* (2006.01)

(52) U.S. Cl.
CPC ........ *H01L 51/5203* (2013.01); *H01L 27/3244* (2013.01); *H01L 51/56* (2013.01); *H01L 51/5212* (2013.01); *H01L 51/5284* (2013.01); *H01L 2251/5315* (2013.01)

(58) Field of Classification Search
CPC ............ H01L 51/5203; H01L 51/5212; H01L 51/5284; H01L 2251/5315
See application file for complete search history.

(56) References Cited

U.S. PATENT DOCUMENTS

| 4,723,838 | A  | * | 2/1988 | Aoki et al. | ...................... | 349/47 |
| 5,953,085 | A  | * | 9/1999 | Shimada | .......................... | 349/39 |
| 7,221,095 | B2 | * | 5/2007 | Yamazaki et al. | ............ | 313/509 |
| 7,291,973 | B2 | * | 11/2007 | Ishihara et al. | ............... | 313/505 |
| 7,728,510 | B2 |   | 6/2010 | Oh | | |
| 8,598,777 | B2 | * | 12/2013 | Fujioka et al. | ................ | 313/500 |
| 2007/0190887 | A1 | * | 8/2007 | Sato et al. | ....................... | 445/24 |

(Continued)

FOREIGN PATENT DOCUMENTS

| KR | 10-0712111 B1 | 4/2007 |
| KR | 10-2010-0128794 A | 12/2010 |
| KR | 10-2012-0019026 A | 3/2012 |

*Primary Examiner* — Ida M Soward
(74) *Attorney, Agent, or Firm* — Knobbe Martens Olson & Bear LLP

(57) ABSTRACT

In an aspect, an organic light emitting diode display including: a substrate; a first electrode and an auxiliary electrode positioned on the substrate and separated from each other; an absorption electrode positioned on the auxiliary electrode; an organic emission layer positioned on the first electrode and having a contact hole exposing the auxiliary electrode and the absorption electrode; and a second electrode positioned on the organic emission layer and connected to the auxiliary electrode and the absorption electrode through the contact hole is provided. In an aspect, the organic light emitting diode (OLED) display may minimize the voltage drop of the driving power passing through the large-sized electrode of the thin film for driving the organic emission layer, and may simplify the removal process of the organic emission layer on the auxiliary electrode by adding the absorption electrode on the auxiliary electrode.

17 Claims, 15 Drawing Sheets

(56) References Cited

U.S. PATENT DOCUMENTS

| | | | |
|---|---|---|---|
| 2008/0284323 A1* | 11/2008 | Kashiwabara et al. | 313/504 |
| 2011/0248297 A1* | 10/2011 | Ito | 257/93 |
| 2012/0252303 A1* | 10/2012 | Otsuka et al. | 445/58 |
| 2013/0056784 A1* | 3/2013 | Lee et al. | 257/99 |
| 2014/0099738 A1* | 4/2014 | Lee et al. | 438/22 |
| 2014/0104743 A1* | 4/2014 | Park | 361/234 |
| 2014/0110680 A1* | 4/2014 | Choe | 257/40 |
| 2014/0239262 A1* | 8/2014 | Kim et al. | 257/40 |
| 2014/0367705 A1* | 12/2014 | Bibl et al. | 257/88 |

* cited by examiner

FIG.15
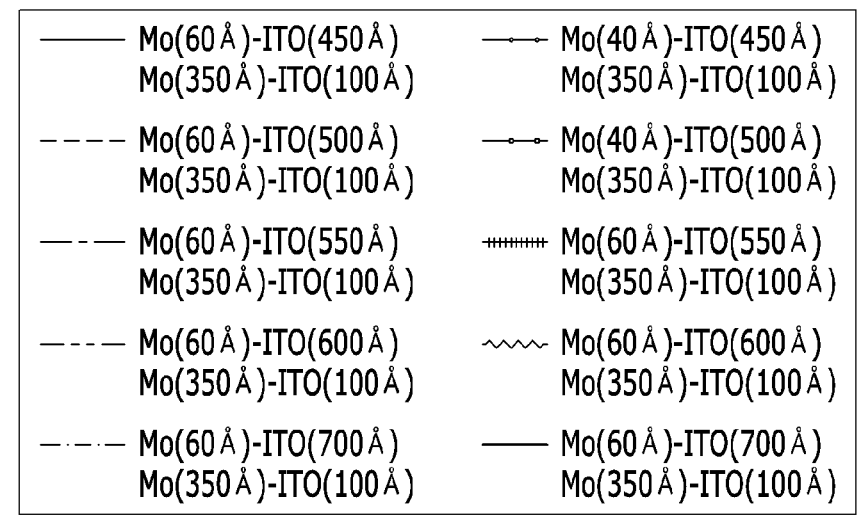
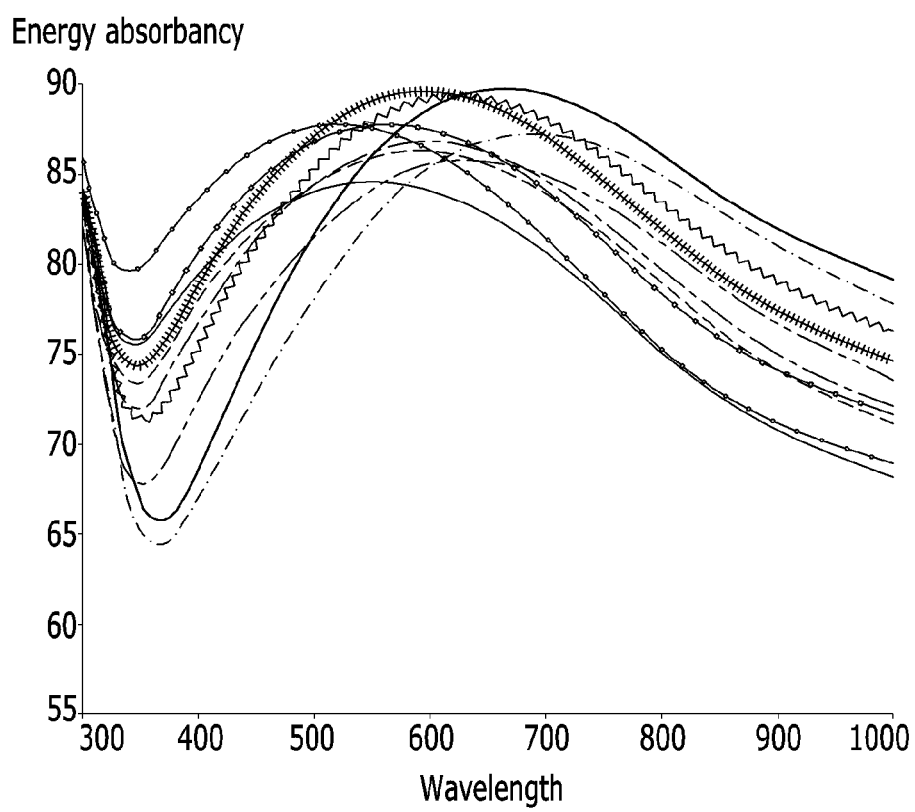

US 9,159,946 B2

ORGANIC LIGHT EMITTING DIODE DISPLAY HAVING AUXILIARY ELECTRODE

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2013-0122831 filed in the Korean Intellectual Property Office on Oct. 15, 2013, the disclosure of which is incorporated herein by reference in its entirety.

BACKGROUND

1. Field

This disclosure relates to an organic light emitting diode display and a manufacturing method thereof. For example, the present disclosure relates to an organic light emitting diode display including an auxiliary electrode and an absorption electrode.

2. Description of the Related Technology

An organic light emitting diode (OLED) display has been recently spotlighted as a display device for displaying images.

A conventional OLED display typically includes a first electrode, an organic emission layer disposed on the first electrode, and a second electrode disposed on the organic emission layer.

An OLED display may be classified into a front emission type, a rear emission type, and a dual emission type. The front emission type OLED display typically has a structure in which a second electrode of an organic light emitting element is formed over the entire area of a substrate where the organic light emitting element is formed in a thin film shape in order to minimize deterioration of luminance of light generated from an organic emission layer.

However, a voltage drop may occur in driving power passing through the second electrode for driving the organic emission layer due to electrical resistance of the second electrode since the second electrode formed as a thin film is formed over the entire area of the substrate in the front emission type of OLED display.

The above information disclosed in this Background section is only for enhancement of understanding of the background of the disclosure and therefore it may contain information that does not form the prior art that is already known to a person of ordinary skill in the art.

SUMMARY

Some embodiments provide an organic light emitting diode (OLED) display that can minimize a voltage drop in driving power passing through a large-sized thin film electrode for driving an organic emission layer and can simplify a removal process of the organic emission layer on an auxiliary electrode by adding an absorption electrode on the auxiliary electrode, and a manufacturing method thereof.

Some embodiments provide an organic light emitting diode display including: a substrate; a first electrode and an auxiliary electrode positioned on the substrate and separated from each other; an absorption electrode positioned on the auxiliary electrode; an organic emission layer positioned on the first electrode and having a contact hole exposing the auxiliary electrode and the absorption electrode; and a second electrode positioned on the organic emission layer and connected to the auxiliary electrode and the absorption electrode through the contact hole.

In some embodiments, the second electrode may contact an etched surface of the contact hole, an upper surface of the auxiliary electrode, and an upper surface and a side surface of the absorption electrode.

In some embodiments, the absorption electrode may be made of one selected from molybdenum (Mo), titanium (Ti), tungsten (W), and chromium (Cr).

In some embodiments, the absorption electrode may be formed of a single layer or multiple layers.

In some embodiments, the absorption electrode may have a thickness of 300-1500 Å when the absorption electrode is formed of a single layer.

In some embodiments, an oxide layer may be further formed between the absorption electrode of the multiple layers when the absorption electrode is formed of multiple layers.

In some embodiments, the absorption electrode may be formed of dual layers, and an upper layer and a lower layer of the absorption electrode may respectively have thicknesses of 40-100 Å and 300-1000 Å.

In some embodiments, the oxide layer may be ITO or IZO.

In some embodiments, the absorption electrode may be formed with a line shape or a dot shape in a direction parallel to the auxiliary electrode on the auxiliary electrode.

In some embodiments, the organic light emitting diode display may further include: a gate line positioned on the substrate; a data line and a driving voltage line insulated from and intersecting the gate line and separated from each other; a switching thin film transistor connected to the gate line and the data line; and a driving thin film transistor connected to the switching thin film transistor and the driving voltage line, wherein the first electrode may be connected to a drain electrode of the driving thin film transistor.

Some embodiments provide an organic light emitting diode display includes: a substrate; a first electrode and an absorption electrode made of one selected from molybdenum (Mo), titanium (Ti), tungsten (W), and chromium (Cr), positioned on the substrate and separated from each other; an organic emission layer positioned on the first electrode and a contact hole exposing the absorption electrode; and a second electrode positioned on the organic emission layer and connected to the absorption electrode through the contact hole, wherein the absorption electrode is connected to the second electrode thereby having a function of an auxiliary electrode of the first electrode.

Some embodiments provide a manufacturing method of an organic light emitting diode display includes: forming a thin film transistor on a substrate; forming a first electrode connected to the thin film transistor and an auxiliary electrode separated from the first electrode; forming an absorption electrode on the auxiliary electrode; forming an organic emission layer on the first electrode, the auxiliary electrode, and the absorption electrode; irradiating an energy light source to the organic emission layer to etch the organic emission layer, thereby forming a contact hole having an opening exposing the auxiliary electrode and the absorption electrode; and depositing a metal layer on the organic emission layer to form a second electrode contacting an upper surface of the auxiliary electrode, an upper surface of the absorption electrode, and an etched surface of the opening in the contact hole.

In some embodiments, the etching of the organic emission layer may use a laser, a flash lamp, or a tungsten halogen lamp as an energy light source.

In some embodiments, the organic light emitting diode (OLED) display may minimize the voltage drop of the driving power passing through the large-sized electrode of the thin film for driving the organic emission layer, and may simplify the removal process of the organic emission layer on the auxiliary electrode by adding the absorption electrode on the auxiliary electrode.

BRIEF DESCRIPTION OF THE DRAWINGS

FIG. 15 is a graph showing a result of measuring absorbency according to a wavelength of light source energy for an absorption electrode that is formed of multiple layers.

DETAILED DESCRIPTION

Figure 1:
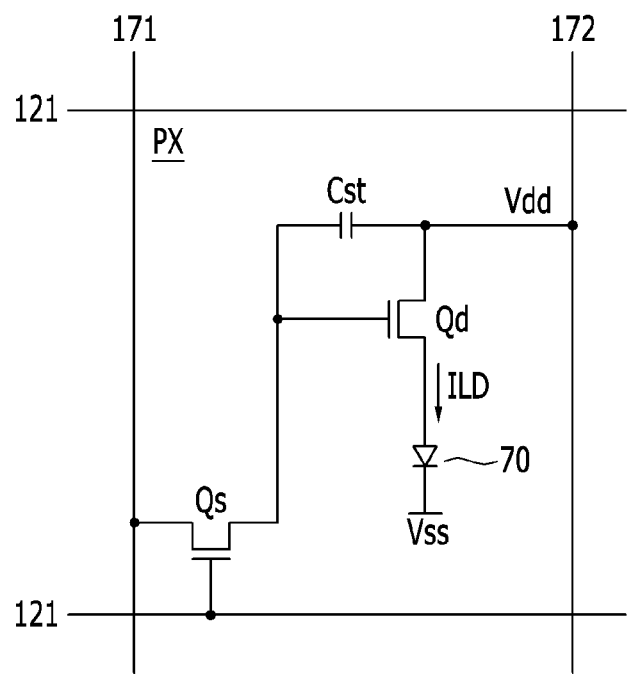
FIG. 1 is a circuit diagram of a pixel circuit of an organic light emitting diode display according to an exemplary embodiment.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic light emitting diode display and a manufacturing method thereof according to an exemplary embodiment will be described with reference to accompanying drawings.

FIG. 1 is a circuit diagram of a pixel circuit of an organic light emitting diode display according to an exemplary embodiment.

As shown in FIG. 1, an organic light emitting diode display according to the exemplary embodiment includes a plurality of signal lines 121, 171, and 172 and a plurality of pixels (PX) connected thereto and arranged in an approximate matrix form.

The signal lines include a plurality of gate lines 121 transferring a gate signal (or a scan signal), a plurality of data lines 171 transferring a data signal, and a plurality of driving voltage lines 172 transferring a driving voltage Vdd. The gate lines 121 extend in an approximate row direction and are almost parallel to each other, and vertical direction portions of the data lines 171 and the driving voltage lines 172 extend in an approximate column direction and are almost parallel to each other.

Each pixel PX includes a switching thin film transistor Qs, a driving thin film transistor Qd, a storage capacitor Cst, and an organic light emitting diode (OLED) 70.

The switching thin film transistor Qs has a control terminal, an input terminal, and an output terminal, the control terminal is connected to the gate line 121, the input terminal is connected to the data line 171, and the output terminal is connected to the driving thin film transistor Qd. The switching thin film transistor Qs transfers the data signal applied to the data line 171 to the driving thin film transistor Qd in response to the scan signal applied to the gate line 121.

Further, the driving thin film transistor Qd has a control terminal, an input terminal, and an output terminal, and the control terminal is connected to the switching thin film transistor Qs, the input terminal is connected to the driving voltage line 172, and the output terminal is connected to the organic light emitting diode 70. The driving thin film transistor Qd allows an output current (ILD) having a varying magnitude according to a voltage applied between the control terminal and the output terminal to flow.

The capacitor Cst is connected between the control terminal and the input terminal of the driving thin film transistor Qd. This capacitor Cst charges the data signal applied to the control terminal of the driving thin film transistor Qd and maintains the data signal after the switching thin film transistor Qs is turned off.

The organic light emitting diode LD has an anode connected to the output terminal of the driving thin film transistor Qd, and a cathode connected to a common voltage Vss. The organic light emitting diode (LD) displays an image by emitting light while changing the intensity thereof according to the output current (ILD) of the driving thin film transistor Qd.

Further, the connection relationship of the thin film transistors Qs and Qd, the capacitor Cst, and the organic light emitting diode 70 may be changed.

The organic light emitting diode display in which the second electrode as a thin film type is entirely formed on the substrate including the organic light emitting element uses an auxiliary electrode forming the second electrode to prevent generation of a voltage drop to a power source passing through the second electrode to drive the organic emission layer by electric resistance of the second electrode.

However, a process of removing an organic layer to contact the auxiliary electrode and the first electrode is required and energy absorbency of the organic layer is low such that energy transmitting efficiency is largely decreased, and the removal process must be performed in a vacuum condition.

Next, an organic light emitting diode display according to an exemplary embodiment of the present invention will be described with reference to FIG. 2 and FIG. 3.

Figure 2:
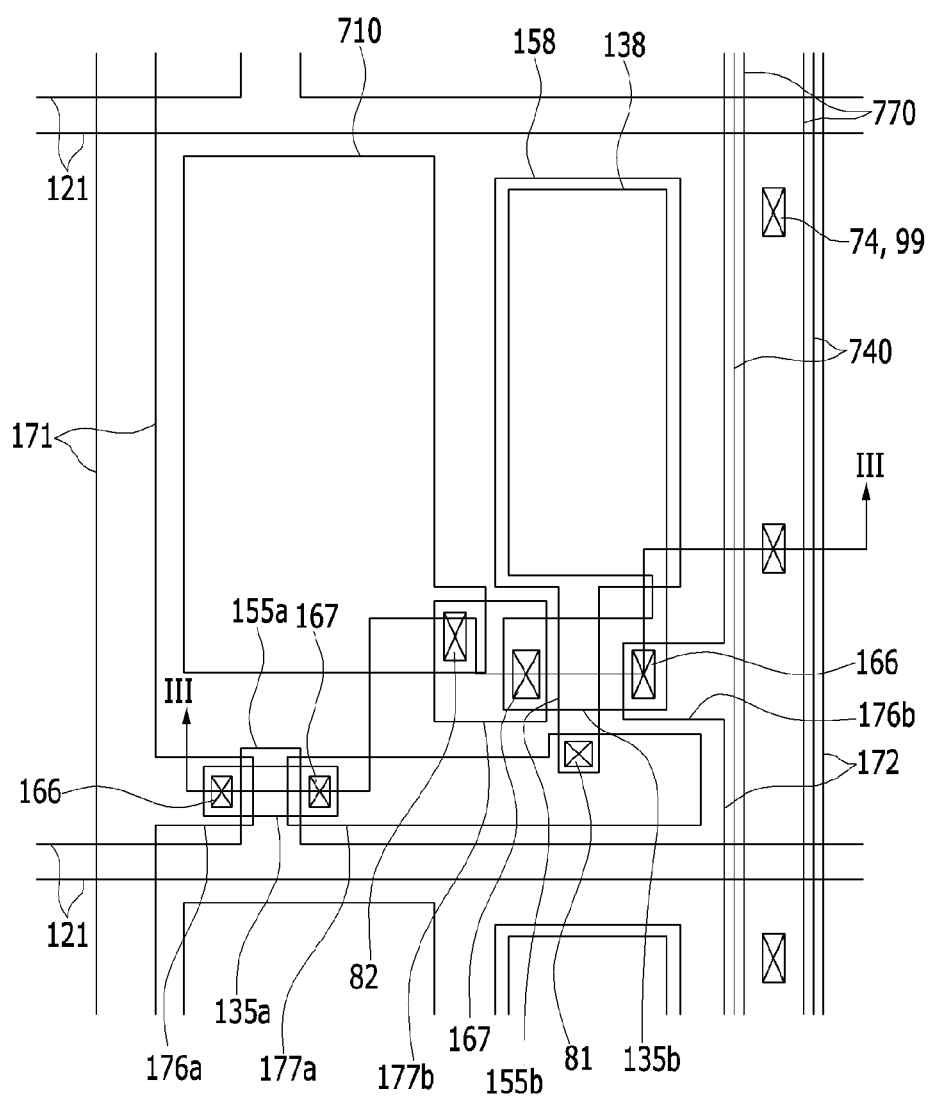
FIG. 2 is a layout view of one pixel of the organic light emitting diode display of FIG. 1.
Figure 3:
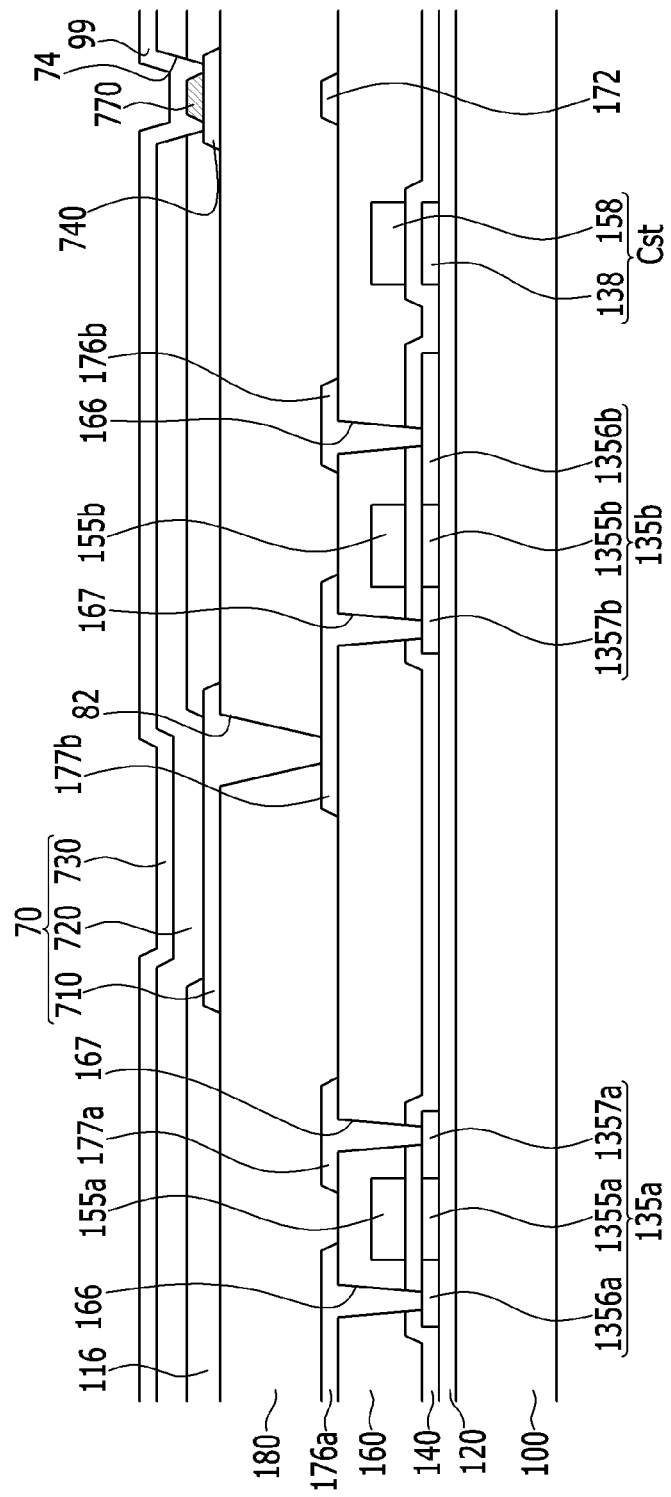
FIG. 3 is a cross-sectional view taken along the line III-III of FIG. 2.

FIG. 2 is a layout view of one pixel of the organic light emitting diode display of FIG. 1, and FIG. 3 is a cross-sectional view taken along the line III-III of FIG. 2.

As shown in FIG. 3, a buffer layer 120 is formed on a substrate 100.

In some embodiments, the substrate 100 may be an insulating substrate made of glass, quartz, ceramic, or a polymer material, or the substrate 100 may be a metallic substrate made of a stainless steel. In some embodiments, the polymer material may be an organic material selected from a group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP) that are insulating organic materials.

In some embodiments, the buffer layer 120 is formed on the substrate 100.

In some embodiments, the buffer layer 120 may be formed to have a structure of a single layer of a silicon oxide (SiOx) or a silicon nitride (SiNx), or a plurality of layers where a silicon nitride (SiNx) and a silicon oxide (SiOx) are laminated. The buffer layer acts to prevent unnecessary components such as an impurity or moisture from permeating, and planarizes the surface.

In some embodiments, a first semiconductor 135a and a second semiconductor 135b may both be made of polysilicon and a first capacitor electrode 138 are formed on the buffer layer 120.

In some embodiments, the first semiconductor 135a and the second semiconductor 135b may be divided into channel regions 1355a and 1355b, and source regions 1356a and 1356b and drain regions 1357a and 1357b respectively formed on both sides of the channel regions 1355a and 1355b. In some embodiments, the channel regions 1355a and 1355b of the first semiconductor 135a and the second semiconductor 135b are polysilicon into which impurities have not been doped, that is, intrinsic semiconductors. In some embodiments, the source regions 1356a and 1356b and the drain regions 1357a and 1357b of the first semiconductor 135a and the second semiconductor 135b are polysilicon into which conductive impurities have been doped, that is, impurity semiconductors.

In some embodiments, the impurities dopes into the source regions 1356a and 1356b, the drain regions 1357a and 1357b, and the first capacitor electrode 138 can be either p-type impurities or n-type impurities.

In some embodiments, a gate insulating layer 140 is formed on the first semiconductor 135a, the second semiconductor 135b, and the first capacitor electrode 138. In some embodiments, the gate insulating layer 140 can be a single layer or a plurality of layers including at least one of tetraethyl orthosilicate (TEOS), a silicon nitride (SiNx), and a silicon oxide (SiO$_x$).

In some embodiments, the gate line 121, a second gate electrode 155b, and a second capacitor electrode 158 are formed on the gate insulating layer 140.

In some embodiments, the gate line 121 (shown in the perspective of FIG. 2) lengthily extends in a horizontal direction and transfers a gate signal, and includes a first gate electrode 155a that is protruded from the gate line 121 to the first semiconductor 135a.

In some embodiments, the first gate electrode 155a and the second gate electrode 155b overlap the respective channel regions 1355a and 1355b, and the second capacitor electrode 158 overlaps the first capacitor electrode 138.

In some embodiments, each of the second capacitor electrode 158, the first gate electrode 155a, and the second gate electrode 155b can have a single layer of a plurality of layers made of molybdenum, tungsten, copper, aluminum, or an alloy thereof.

In some embodiments, the first capacitor electrode 138 and the second capacitor electrode 158 form a capacitor Cst using the gate insulating layer 140 as a dielectric material.

In some embodiments, a first interlayer insulating layer 160 is formed on the first gate electrode 155a, the second gate electrode 155b, and the second capacitor electrode 158. In some embodiments, the first interlayer insulating layer 160, like the gate insulating layer 140, can be made of tetraethyl orthosilicate (TEOS), a silicon nitride (SiNx), or a silicon oxide (SAX).

In some embodiments, the first interlayer insulating layer 160 and the gate insulating layer 140 include a source contact hole 166 and a drain contact hole 167 through which the source regions 1356a and 1356b and the drain regions 1357a and 1357b are exposed, respectively.

In some embodiments, the data lines 171 including a first source electrode 176a, the driving voltage lines 172 including a second source electrode 176b, a first drain electrode 177a (not shown), and a second drain electrode 177b are formed on the first interlayer insulating layer 160.

In some embodiments, the data line 171 transmits a data signal and extends in a direction crossing the gate line 121.

In some embodiments, the driving voltage line 172 transmits a predetermined voltage, and extends in the same direction as that of the data line 171 while being separated from the data line 171.

In some embodiments, the first source electrode 176a protrudes toward the first semiconductor 135a from the data line 171, and the second source electrode 176b protrudes toward the second semiconductor 135b from the driving voltage line 172. In some embodiments, the first source electrode 176a and the second source electrode 176b are connected with the source regions 1356a and 1356b through the source contact holes 166, respectively.

In some embodiments, the first drain electrode 177a (not shown) faces the first source electrode 176a and is connected with the drain region 1357a through the drain contact hole 167.

The first drain electrode 177a (not shown) extends along the gate line, and is electrically connected with the second gate electrode 158b through a contact hole 81.

In some embodiments, the second drain electrode 177b is connected with the drain region 1357b through the drain contact hole 167.

In some embodiments, the data line 171, the driving voltage line 172, and the first drain electrode 177a may be formed as a single layer or a multilayer formed of a low resistance material, such as Al, Ti, Mo, Cu, Ni, or an alloy thereof, or a corrosion resistant material. For example, the data line 171, the driving voltage line 172, and the first drain electrode 177a may be triple layers of Ti/Cu/Ti or Ti/Ag/Ti.

In an exemplary embodiment, the capacitor may be formed by overlapping the first capacitor electrode and the second capacitor electrode, but the capacitor having a metal/dielectric/metal structure may be formed by forming an electrode on the same layer as that of the data line or the same layer as that of the first electrode.

In some embodiments, a second interlayer insulating layer 180 is formed on the data line 171, the driving voltage line 172, the first drain electrode 177a (not shown), and a first electrode 710.

In some embodiments, the first electrode 710 and an auxiliary electrode 740 are formed on the second interlayer insulating layer 180.

The first electrode 710 may be an anode of the organic light emitting element of FIG. 1. In some embodiments, the first electrode 710 is connected to the second drain electrode 177b through a contact hole 82.

In an exemplary embodiment, the second drain electrode 177b and the first electrode 710 are connected through the contact hole 82 with the second interlayer insulating layer 180 interposed therebetween, but the second drain electrode 177b and the first electrode 710 may be integrally formed.

In some embodiments, the auxiliary electrode 740 is separated from the first electrode 710, overlaps at least one of the data line 171 and the driving voltage line 172, and is elongated along with them. In some embodiments, the auxiliary electrode 740 may be applied with the same voltage as a second electrode 730 to reduce the voltage drop of the second electrode 730.

In some embodiments, an absorption electrode 770 is formed on the auxiliary electrode 740.

In some embodiments, the auxiliary electrode 740 is generally connected to the second electrode 730, and to connect the auxiliary electrode 740 and the second electrode 730 to each other, an organic emission layer 720 disposed between the auxiliary electrode 740 and the second electrode 730 must be removed. In this configuration, the organic emission layer 720 has the low energy absorbency and the energy transmission efficiency is largely decreased such that the absorption electrode 770 easily absorbs the energy by being disposed between the organic emission layer 720 and the auxiliary electrode 740, and thereby the organic emission layer 720 may be further simply removed by a method of vaporizing the organic emission layer 720 by increasing the temperature of the organic emission layer 720.

In some embodiments, the absorption electrode 770 absorbs the energy when removing the organic emission layer 720 such that a material for the absorption electrode 770 must have the high energy absorbency, and the absorption electrode 770 is disposed between the auxiliary electrode 740 and the second electrode 730 such that the material must have conductivity for an electrical connection between the auxiliary electrode 740 and the second electrode 730.

Accordingly, the absorption electrode 770 may be a metal material having high absorbency and conductivity and may be formed of one selected from molybdenum (Mo), titanium (Ti), tungsten (W), and chromium (Cr).

In some embodiments, the absorption electrode 770 may be formed with a thickness of 300-1500 Å, and the energy absorbency is excellent in this range.

In some embodiments, the absorption electrode 770 may be formed of the single layer or the multiple layers.

When the absorption electrode 770 is formed of a plurality layers, an oxide layer (not shown) may be formed between a plurality of absorption electrodes 770.

In some embodiments, the oxide layer may be one selected from ITO or IZO, and may have a thickness of 400-800 Å.

Among the absorption electrode 770 of the plurality of layers, a lower layer may be thicker than an upper layer, and the upper layer of a thickness of 40-100 Å and the lower layer of a thickness of 300-1000 Å may be formed.

In some embodiments, a pixel definition layer 116 patterned with an insulating material exposing at least a portion of the first electrode 710 and the auxiliary electrode 740 and the entire portion of the absorption electrode 770 is formed on the entire substrate including the first electrode 710, and the organic emission layer 720 including an emission layer is formed on the pixel definition layer 116 formed on the entire substrate including the first electrode 710 and the exposed portion of the first electrode 710. In some embodiments, the organic emission layer 720 includes a contact hole 74 exposing the auxiliary electrode 740 and the absorption electrode 770.

As shown in the exemplary embodiment of FIG. 2, a plurality of contact holes 74 are disposed with a uniform interval, however it may be elongated along with the auxiliary electrode 740.

In some embodiments, the organic emission layer 720 may be formed of a low molecular weight organic material or a high molecular weight organic material such as PEDOT ((poly)3,4-ethylenedioxythiophene). Further, the organic emission layer 720 may be formed of a multilayer including one or more of a hole injection layer (HIL), a hole transport layer (HTL), an electron transport layer (ETL), and an electron injection layer (EIL), and the emission layer. When all the layers are included, the hole injection layer (HIL) is disposed on the first electrode 710 as the anode, and the hole transport layer (HTL), the emission layer, the electron transport layer (ETL), and the electron injection layer (EIL) are sequentially laminated thereon.

In the organic emission layer 720, a red organic emission layer, a green organic emission layer, and a blue organic emission layer may be laminated in a red pixel, a green pixel, and a blue pixel, respectively, and a red color filter, a green color filter, and a blue color filter may be formed for each pixel to embody a color image. As another example, a white organic emission layer emitting light having a white color may be formed in all of the red pixel, the green pixel, and the blue pixel, and the red color filter, the green color filter, and the blue color filter may be formed for each pixel to embody the color image.

For the organic emission layer 720 according to the present invention, the lamination structures of the red pixel, the blue pixel, and the green pixel are the same. Accordingly, a deposition mask for depositing the organic emission layer on each pixel, that is, the red pixel, the green pixel, and the blue pixel, may not be used.

The white organic emission layer described as another example may be formed of one organic emission layer, and even includes a constitution where a plurality of organic emission layers are laminated to emit light having the white color. For example, a constitution where at least one yellow organic emission layer and at least one blue organic emission layer are combined to emit light having the white color, a constitution where at least one cyan organic emission layer and at least one red organic emission layer are combined to emit light having the white color, or a constitution where at least one magenta organic emission layer and at least one green organic emission layer are combined to emit light having the white color may be included.

In some embodiments, the second electrode 730 is formed on an opening 99 exposing the organic emission layer 720 and the contact hole 74.

In some embodiments, the second electrode 730 becomes a cathode of the organic light emitting element. Accordingly, the first electrode 710 and the absorption electrode 770, the organic emission layer 720, and the second electrode 730 form the organic light emitting element 70.

In some embodiments, the second electrode 730 contacts an upper surface of the auxiliary electrode 740, an upper surface and a side surface of the absorption electrode 770, and an etched surface of the opening 99 in the contact hole 74.

In some embodiments, the organic light emitting diode display may have any one structure among a top display type, a rear display type, and a both-side display type according to a direction in which the organic light emitting diode 70 emits light.

In the top display type of organic light emitting diode display according to the exemplary embodiment, the first electrode 710 is formed as a reflective layer, and the second electrode 730 is formed as a transparent layer or a semi-transparent layer.

In some embodiments, the reflective layer and the semi-transparent layer are formed of at least one metal among magnesium (Mg), silver (Ag), gold (Au), calcium (Ca), lithium (Li), chromium (Cr), and aluminum (Al), or an alloy thereof. The reflective layer and the semi-transparent layer are determined by thickness, and the semi-transparent layer may be formed to have a thickness equal to or less than 200 nm. As the thickness is decreased, transmittance of light is increased, but when the thickness is excessively small, resistance is increased. In some embodiments, the transparent layer may be formed of a material such as indium tin oxide (ITO), indium zinc oxide (IZO), zinc oxide (ZnO), or indium oxide ($In_2O_3$).

As described above, when forming the auxiliary electrode 740 and the absorption electrode 770 that are connected to the second electrode 730, the voltage drop of the driving voltage passing through the second electrode 730 that is formed on the entire substrate 100 may be minimized and the contact hole 74 may be simply formed.

An organic light emitting diode display according to another exemplary embodiment will be described with reference to FIG. 4.

Figure 4:
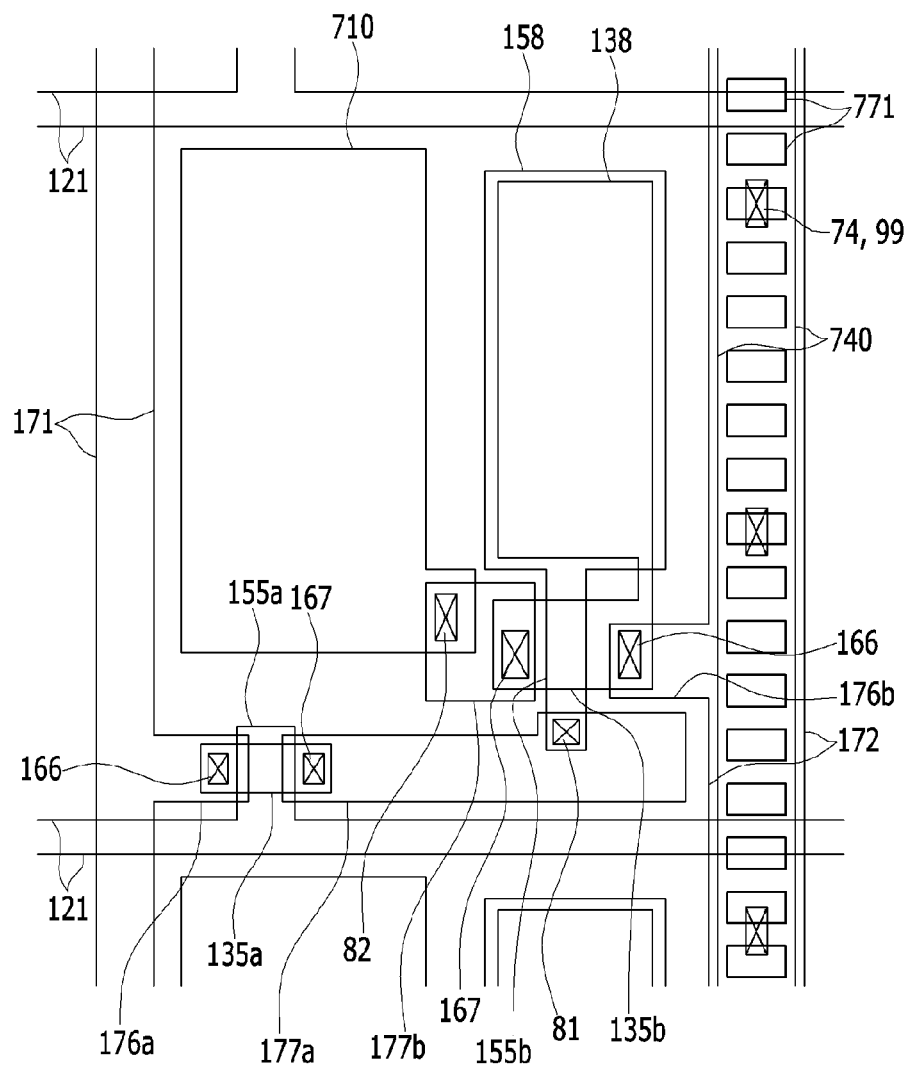
FIG. 4 is a layout view of one pixel of an organic light emitting diode display according to another exemplary embodiment.

FIG. 4 is a layout view of one pixel of an organic light emitting diode display according to another exemplary embodiment of the present invention.

The exemplary embodiment shown in FIG. 4 is substantially the same as the exemplary embodiment shown in FIG. 2 and FIG. 3, except for a formation position and a shape of the absorption electrode 770 such that the overlapping description of reference numerals is omitted.

As shown in the exemplary embodiment of FIG. 4, an absorption electrode 771 of the organic light emitting diode display does not have the line shape parallel to the auxiliary electrode 740, but the absorption electrode 771 may be formed with a dot shape on the auxiliary electrode 740. In FIG. 4, a plurality of absorption electrodes 771 have a quadrangle shape, however the shape of the absorption electrode may be various such as triangle or a polygon.

An organic light emitting diode display according to another exemplary embodiment will be described with reference to FIG. 5 and FIG. 6.

Figure 5:
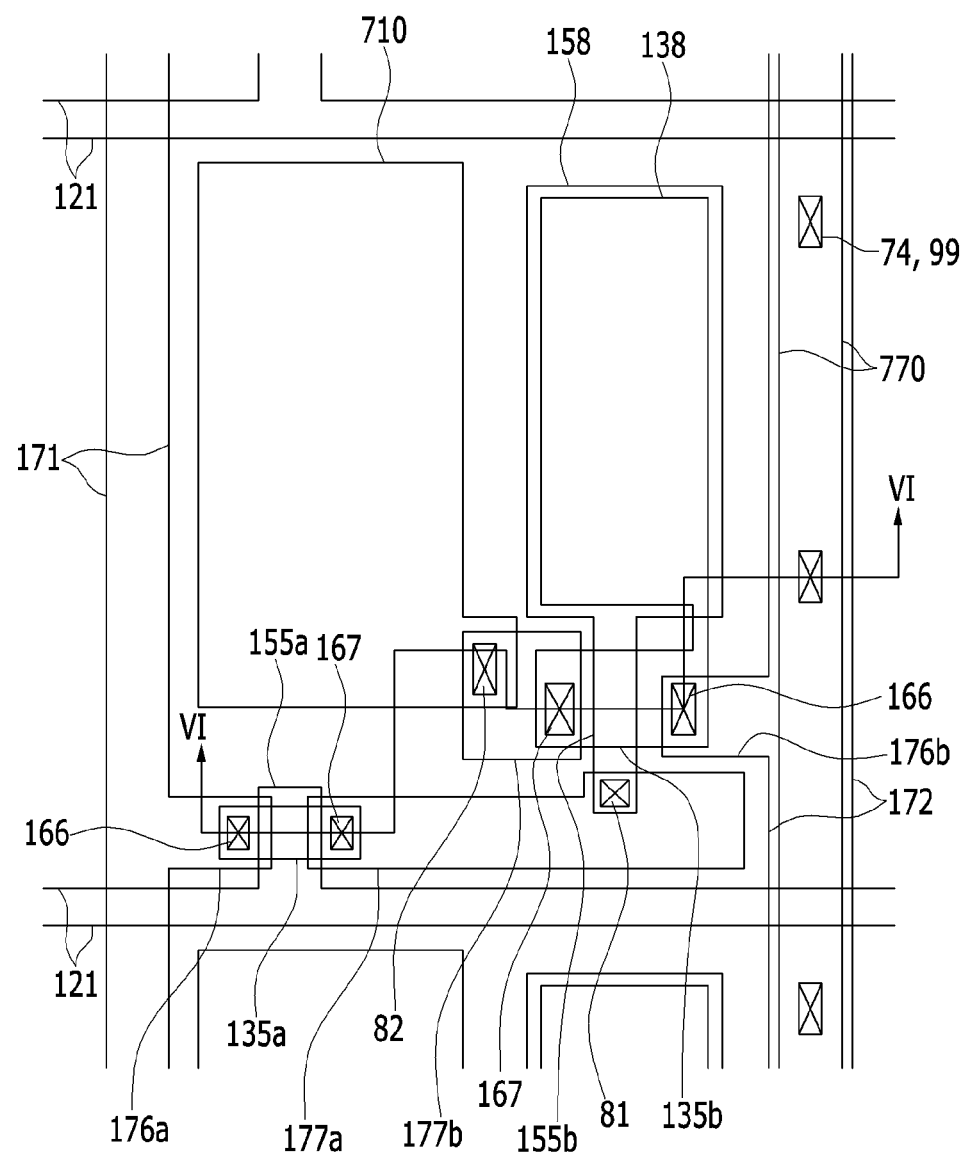
FIG. 5 is a layout view of one pixel of an organic light emitting diode display according to another exemplary embodiment.
Figure 6:
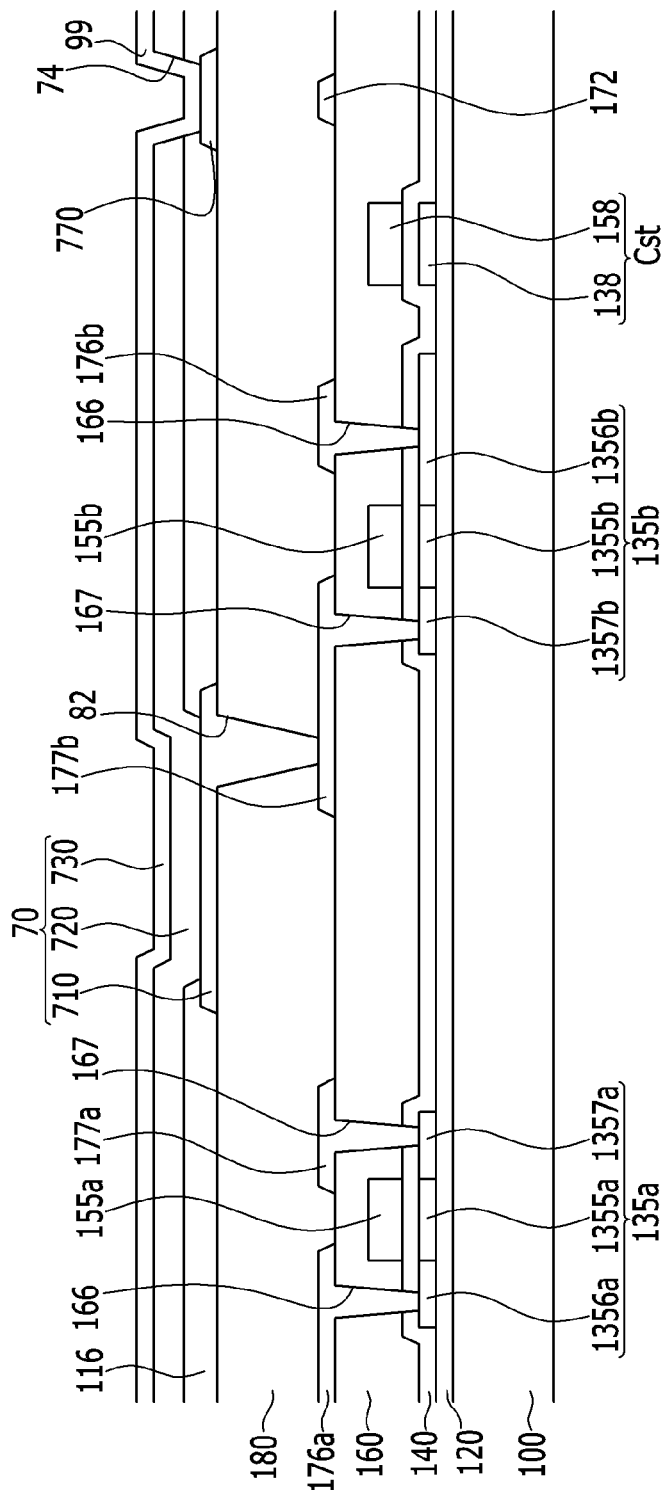
FIG. 6 is a cross-sectional view taken along the line VI-VI of FIG. 5.

FIG. 5 is a layout view of one pixel of an organic light emitting diode display according to the current exemplary embodiment of the present invention, and FIG. 6 is a cross-sectional view taken along the line VI-VI of FIG. 5.

The exemplary embodiment shown in FIG. 5 and FIG. 6 is substantially the same as the exemplary embodiment shown in FIG. 2 and FIG. 3, except that the auxiliary electrode 740 is replaced by the absorption electrode 770 such that the overlapping description of reference numerals is omitted.

In some embodiments, the absorption electrode 770 is separated from the first electrode 710, overlaps at least one of the data line 171 and the driving voltage line 172, and is elongated along with them. In some embodiments, the absorption electrode 770 with a function of the auxiliary electrode to reduce the voltage drop of the second electrode 730 may be applied with the same voltage as the second electrode 730.

In some embodiments, the absorption electrode 740 is connected to the second electrode 730 to connect the absorption electrode 770 and the second electrode 730 to each other, the organic emission layer 720 disposed between the absorption electrode 770 and the second electrode 730 must be removed. In some embodiments, the organic emission layer 720 has the low energy absorbency and the energy transmission efficiency is largely decreased such that the absorption electrode 770 easily absorbs the energy by being disposed as the auxiliary electrode, and thereby the organic emission layer 720 may be further simply removed by the method of vaporizing the organic emission layer 720 by increasing the temperature of the organic emission layer 720.

In some embodiments, the absorption electrode 770 absorbs the energy when removing the organic emission layer 720 such that the material for the absorption electrode 770 must have high energy absorbency, and the absorption electrode 770 has the function of the auxiliary electrode such that the material must have conductivity for an electrical connection between the absorption electrode 770 and the second electrode 730.

Accordingly, the absorption electrode 770 may be the metal material having the high absorbency and the conductivity and may be formed of one selected from molybdenum (Mo), titanium (Ti), tungsten (W), and chromium (Cr).

In some embodiments, the absorption electrode 770 may be formed with a thickness of 300-1500 Å, and the energy absorbency is excellent in this range.

In some embodiments, the absorption electrode 770 may be formed of the single layer or the multiple layers.

In some embodiments, an oxide layer (not shown) may be formed between a plurality of absorption electrodes 770 when the absorption electrode 770 is formed of multiple layers.

In some embodiments, the oxide layer may be one selected from ITO or IZO, and may have a thickness of 400-800 Å.

In this configuration, among the absorption electrode 770 of the plurality of layers, a lower layer may be thicker than an upper layer, and the upper layer of a thickness of 40-100 Å and the lower layer of a thickness of 300-1000 Å may be formed.

In some embodiments, the organic emission layer 720 is formed on the entire substrate including the first electrode 710. In some embodiments, the organic emission layer 720 includes the contact hole 74 exposing the absorption electrode 770 functioning as the auxiliary electrode.

Next, a method manufacturing the organic light emitting diode display will be described in detail with reference to FIG. 7 to FIG. 13 as well as FIG. 2 and FIG. 3.

FIGS. 7 to 13 are cross-sectional views sequentially showing a manufacturing method of an organic light emitting diode display according to another exemplary embodiment of the present invention.

Figure 7:
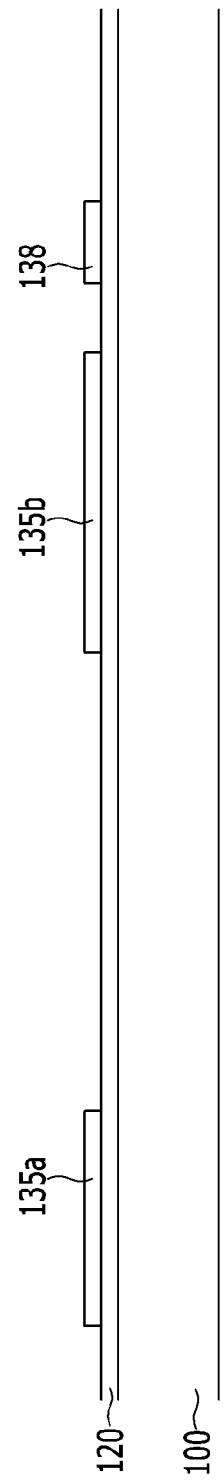
FIGS. 7 to 13 are cross-sectional views sequentially showing a manufacturing method of an organic light emitting diode display according to another exemplary embodiment.

As shown in FIG. 7, the buffer layer 120 is formed on a substrate 100. In some embodiments, the buffer layer 120 may be formed of a silicon nitride or a silicon oxide.

After forming a polysilicon film on the buffer layer 120, the first semiconductor 135*a*, the second semiconductor 135*b*, and the first capacitor electrode 138 are formed by patterning the polysilicon film.

Figure 8:
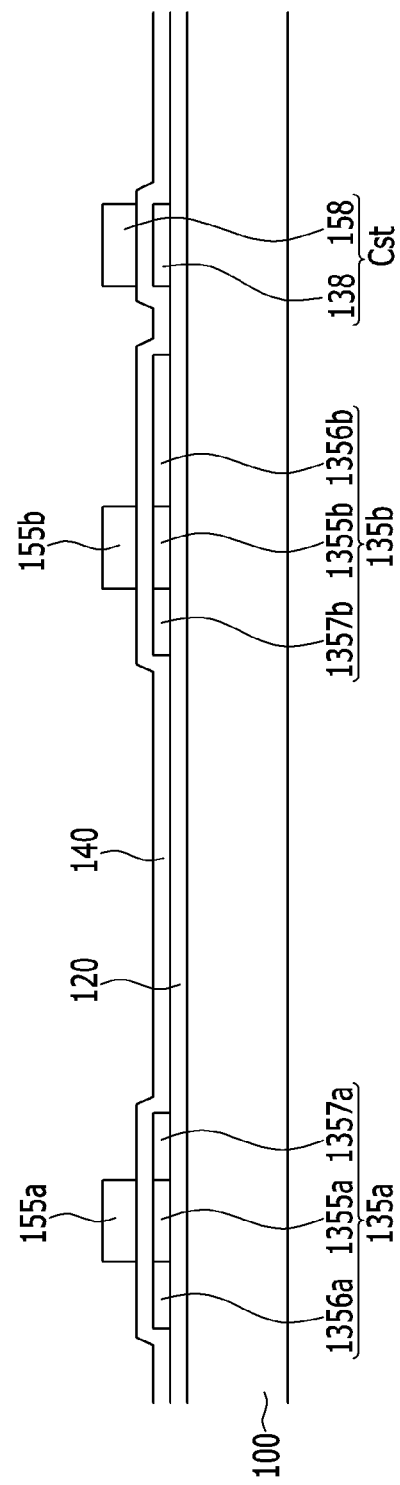

Next, as shown in FIG. 8, the gate insulating layer 140 may be formed on the first semiconductor 135*a* and the second semiconductor 135*b*. In some embodiments, the gate insulating layer 140 may be formed of a silicon nitride or a silicon oxide.

Furthermore, after stacking a metal film on the gate insulating layer 140, the first and second gate electrodes 155*a* and 155*b* and the second capacitor electrode 158 are formed by patterning the metal film.

In some embodiments, the source region, the drain region, and the channel region may be formed by doping conductive impurities into the first semiconductor 135*a* and the second semiconductor 135*b* by using the first gate electrode 155*a* and the second gate electrode 155*b* as a mask. In some embodiments, prior to the formation of the first gate electrode 155*a* and the second gate electrode 155*b*, the conductive impurities can also be doped into the first capacitor electrode 138 using a photoresist film. Furthermore, if each of the first gate electrode 155*a* and the second gate electrode 155*b* is formed of a dual layer and the second capacitor electrode 158 is formed of a single layer, the conductive impurities can also be doped into the first capacitor electrode 138 along with the source region and the drain region.

Figure 9:
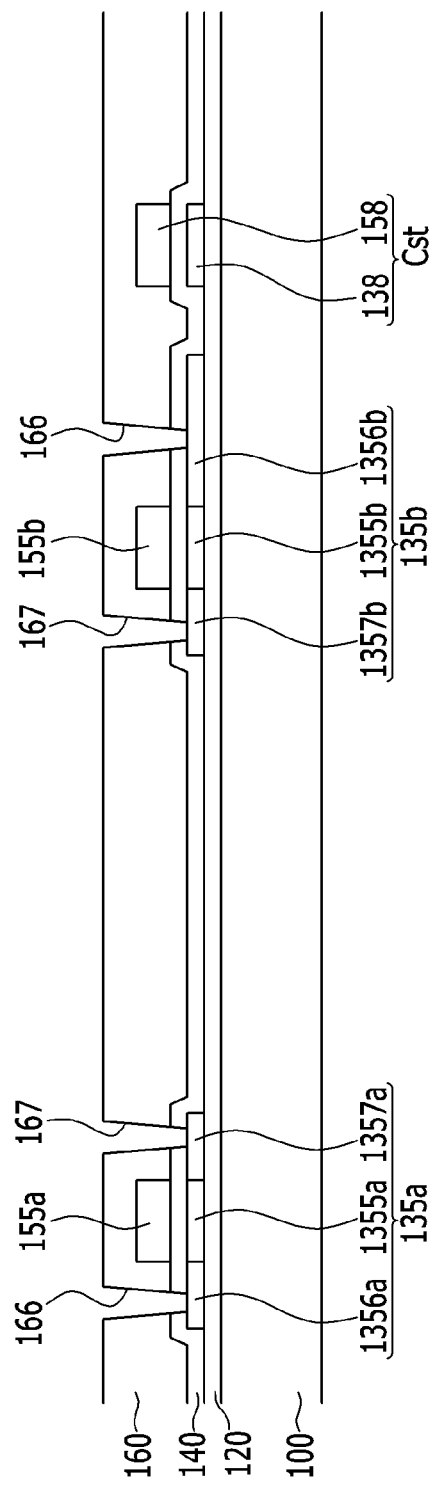

As shown in FIG. 9, the interlayer insulating layer 160 having the contact holes 166 and 167 through which the source region and the drain region are respectively exposed is formed on the first and second gate electrodes 155a and 155b and the second capacitor electrode 158. In some embodiments, the interlayer insulating layer 160 can be made of tetraethyl orthosilicate (TEOS), a silicon nitride, or a silicon oxide. Furthermore, the interlayer insulating layer 160 can be made of a low dielectric constant material in order to make the substrate flat.

Figure 10:
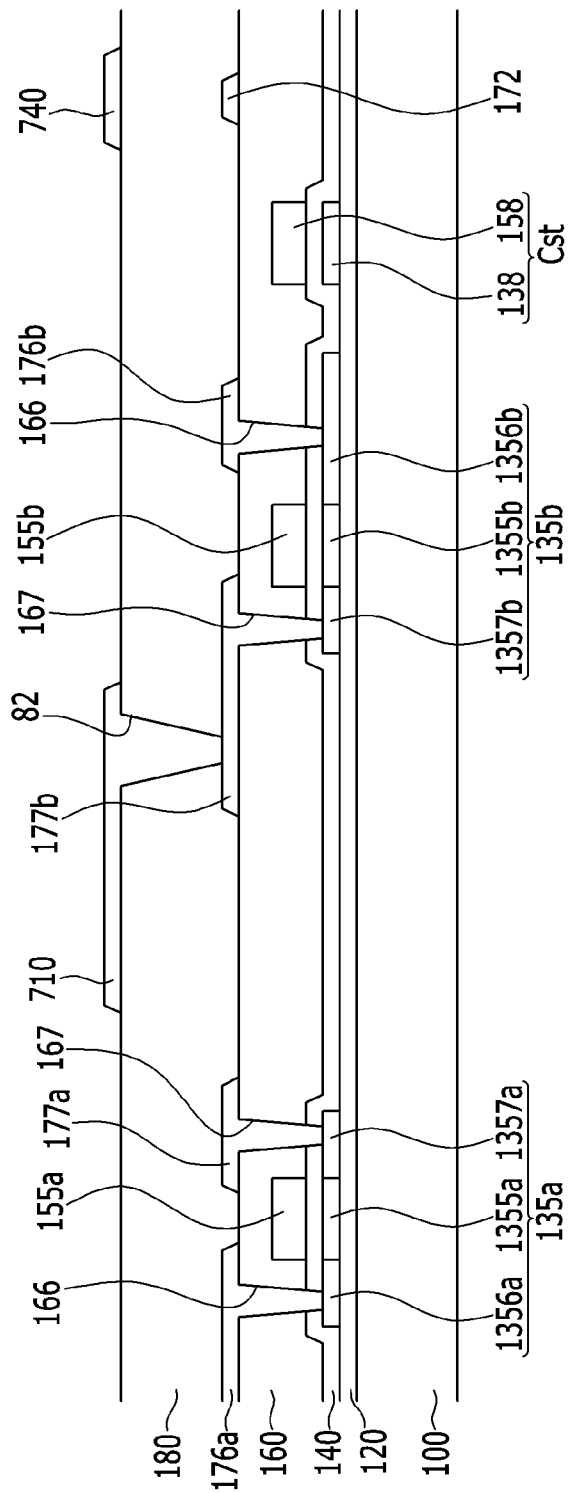

Next, as shown in FIG. 10, ITO/Ag/ITO is deposited and patterned on the interlayer insulating layer 160 to form the first electrode 710 and the auxiliary electrode 740.

Figure 11:
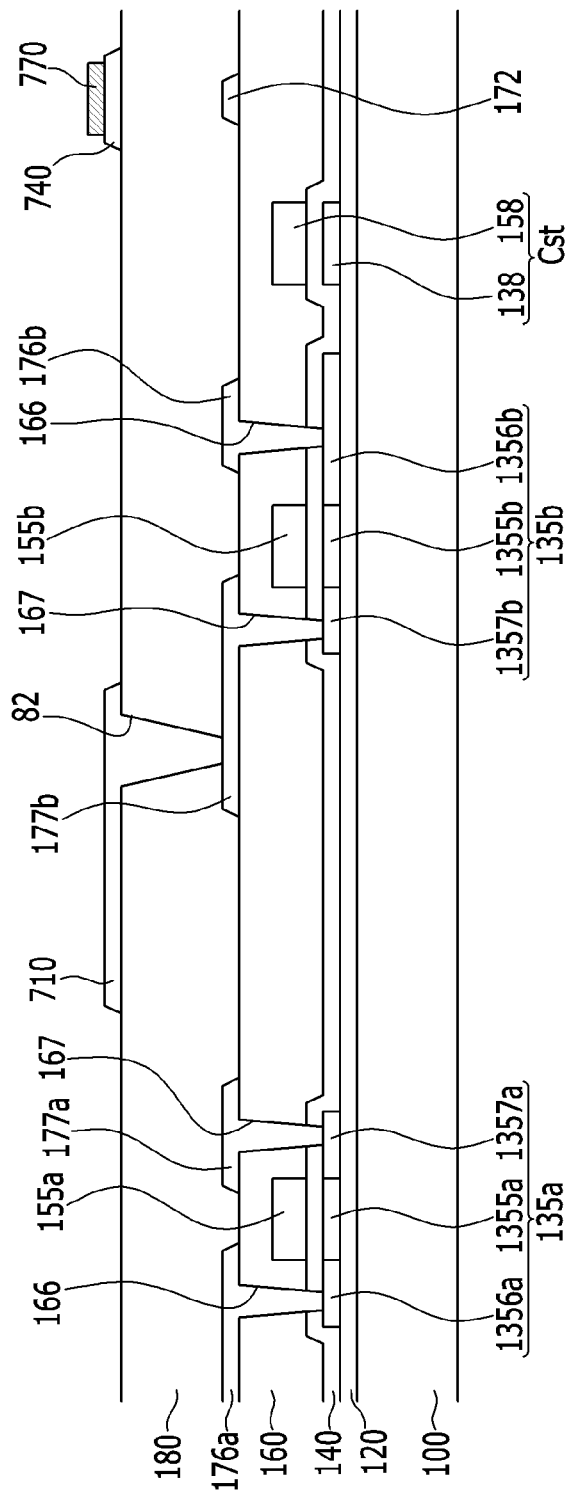

Next, as shown in FIG. 11, the absorption electrode 770 is formed on the auxiliary electrode 740.

In some embodiments, the absorption electrode 770 absorbs the energy when removing the organic emission layer 720 such that the material for the absorption electrode 770 must have the high energy absorbency, and the absorption electrode has the function of the auxiliary electrode 740 such that the material must have conductivity for the electrical connection between the absorption electrode 770 and the second electrode 730.

Accordingly, the absorption electrode 770 may be the metal material having the high absorbency and the conductivity and may be formed of one selected from molybdenum (Mo), titanium (Ti), tungsten (W), and chromium (Cr).

In some embodiments, the absorption electrode 770 may be formed with a thickness of 300-1500 Å, and the energy absorbency is excellent in this range.

In some embodiments, the absorption electrode 770 may be formed of the single layer or the multiple layers.

When the absorption electrode 770 is formed of multiple layers, an oxide layer (not shown) may be formed between a plurality of absorption electrodes.

The oxide layer may be one selected from ITO or IZO, and may have a thickness of 400-800 Å.

In this configuration, among the absorption electrode 770 of the plurality of layers, a lower layer may be thicker than an upper layer, and the upper layer of the thickness of 40-100 Å and the lower layer of the thickness of 300-1000 Å may be formed.

In some embodiments, the absorption electrode 770 may be formed with the line shape parallel to the auxiliary electrode 740, as shown in FIG. 4, may be formed with the dot shape on the auxiliary electrode 740.

In some embodiments, the absorption electrode 770 absorbs the energy when removing the organic emission layer 720 such that the material for the absorption electrode 770 must have the high energy absorbency, and the absorption electrode 770 is disposed between the auxiliary electrode 740 and the second electrode 730 such that the material must have conductivity for an electric connection between the auxiliary electrode 740 and the second electrode 730.

Accordingly, the absorption electrode 770 may be a metal material having high absorbency and conductivity and may be formed of one selected from molybdenum (Mo), titanium (Ti), tungsten (W), and chromium (Cr).

In some embodiments, the absorption electrode 770 may be formed with a thickness of 300-1500 Å, and the energy absorbency is excellent in this range.

In some embodiments, the absorption electrode 770 may be formed of the single layer or the multiple layers.

When the absorption electrode 770 is formed of multiple layers, an oxide layer (not shown) may be formed between a plurality of absorption electrodes 770.

The oxide layer may be one selected from ITO or IZO, and may have a thickness of 400-800 Å.

At this time, among the absorption electrode 770 of the plurality of layers, the lower layer may be thicker than the upper layer, and the upper layer of the thickness of 40-100 Å and the lower layer of the thickness of 300-1000 Å may be formed.

Figure 12:
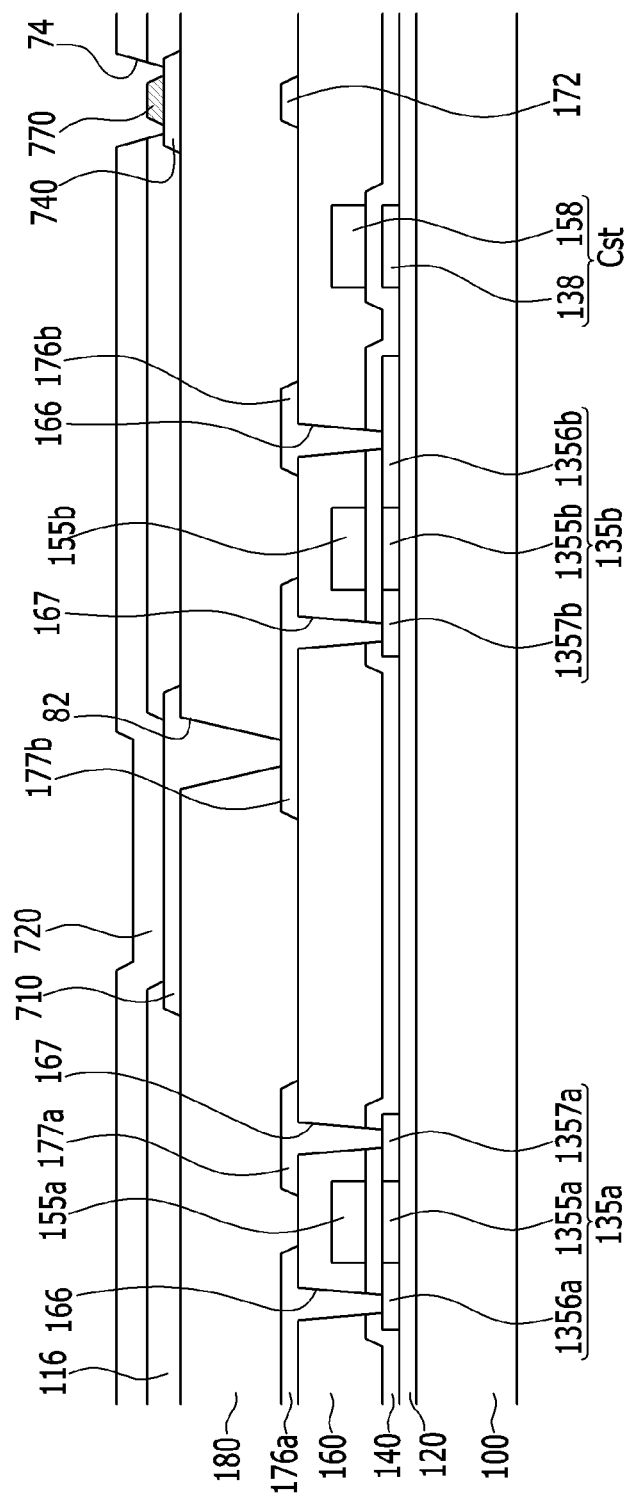

Next, as shown in FIG. 12, on the first electrode 710, the auxiliary electrode 740, and the absorption electrode 770, the pixel definition layer 116 patterned with the insulating material is formed to expose at least a portion of the first electrode 710 and the auxiliary electrode 740, and the entire absorption electrode 770, and the organic emission layer 720 is deposited on the pixel definition layer 116, the exposed first electrode 710, the auxiliary electrode 740, and the absorption electrode 770.

In some embodiments, the organic emission layer 720 is formed on the entire substrate without a separate mask, and a hole auxiliary layer, a red organic emission layer, a green organic emission layer, a blue organic emission layer, and an electron auxiliary layer may be sequentially deposited.

Next, a light source having energy having a wavelength region to be absorbed into the absorption electrode 770 to etch the organic emission layer 720, and the second electrode 730 having the opening 99 exposing the auxiliary electrode 740 and the absorption electrode 770 and the contact hole 74, are formed.

Conventionally, a laser is used when etching the organic emission layer 720, however, when manufacturing the organic light emitting diode display according to an exemplary embodiment, the energy absorbency of the absorption electrode 770 is high such that a laser, a flash lamp, a tungsten halogen lamp, etc., may be used as an energy light source used to etch the organic emission layer 720.

In some embodiments, the energy irradiated by the light source is easily absorbed to the absorption electrode 770 such that the temperature of the absorption electrode 770 is increased, and at this time, the organic emission layer 720 formed on the absorption electrode 770 may be etched by the method of increasing the temperature of the organic emission layer 720 and evaporating the organic emission layer 720.

In some embodiments of the manufacturing of the organic light emitting diode display, the method of increasing the temperature of the organic emission layer 720 and evaporating the organic emission layer 720 by using the absorption electrode 770 is performed in the etching process to form the opening 99 in the organic emission layer 720 such that a patterning mask for the etching of the organic emission layer 720 may be omitted.

Figure 13:
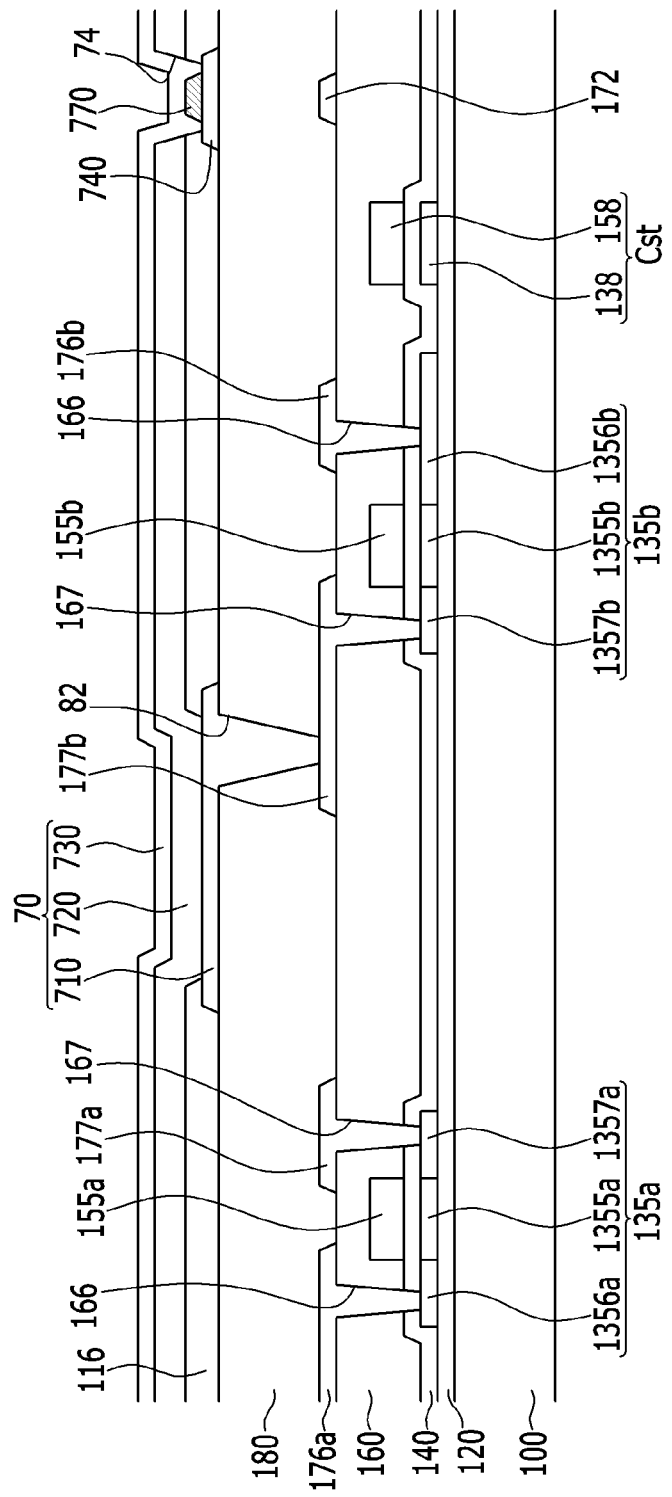

Next, as shown in FIG. 13, a metal layer is formed on the entire substrate to form the second electrode 730 on the organic emission layer 720 and connected to the auxiliary electrode 740 and the absorption electrode 770 exposed through the opening 99 of the organic emission layer 720.

In some embodiments, the metal layer as the semi-transparent layer may be formed by depositing a Mg—Ag alloy. In some embodiments, the second electrode 730 is formed with a thickness of about 500 nm.

Exemplary Embodiment 1

When Forming an Absorption Electrode of a Single Layered Structure, Absorbency Measuring According to Wavelength The energy absorbency of the light irradiated from the energy light source is measured when forming the absorption electrode of the single layer in the organic light emitting diode display according to an exemplary embodiment of the present invention.

In some embodiments, a flash lamp is used as the energy light source.

Figure 14:
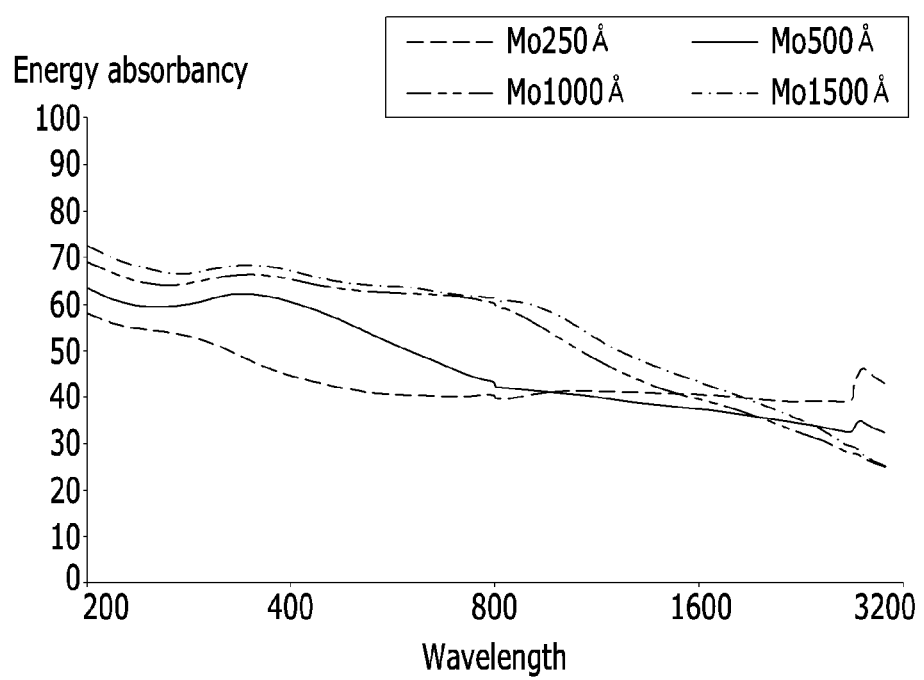
FIG. 14 is a graph showing a result of measuring absorbency according to a wavelength of light source energy for an absorption electrode that is formed of a single layer.

In some embodiments, the material of the absorption electrode is molybdenum (Mo), the absorbency is measured for the thicknesses 250 Å, 500 Å, 1000 Å, and 1500 Å of the absorption electrode, and a result thereof is shown in FIG. 14.

In the graph shown in FIG. 14, the horizontal axis represents a wavelength of the light source and the vertical axis represents the energy absorbency of the light source. As shown in FIG. 14, in the absorption electrode of the single layer, it may be confirmed that the absorbency of the light source energy is more than 50% in the thickness of the absorption electrode of more than 500 Å in the visible light region.

Exemplary Embodiment 2

When Forming an Absorption Electrode of a Single Layered Structure, Absorbency Measuring According to Wavelength In the organic light emitting diode display according to another exemplary embodiment, the energy absorbency of the light irradiated from the energy light source is measured when forming the absorption electrode of the multiple layers.

In some embodiments, the energy light source uses the flash lamp.

In some embodiments, the material for the absorption electrode uses the dual layer of molybdenum (Mo), the thickness of the upper absorption electrode is 40 Å and 60 Å, and the thickness of the lower absorption electrode is 350 Å. The oxide layer between the upper and lower absorption electrodes uses ITO, and the thickness of the oxide layer is respectively 450 Å, 500 Å, 550 Å, 600 Å, and 700 Å to measure of the energy absorbency of the light source, and the result thereof is shown in FIG. 15.

In the graph shown in FIG. 15, the horizontal axis represents the wavelength of the light source and the vertical axis represents the energy absorbency of the light source. As shown in FIG. 15, in the absorption electrode of the multiple layers, it may be confirmed that the energy absorbency of the light source is more than 65% in the visible light region.

The organic light emitting diode (OLED) display according to an exemplary embodiment may minimize the voltage drop of the driving power passing through the large-sized electrode of the thin film for driving the organic emission layer, and may simplify the removal process of the organic emission layer on the auxiliary electrode by adding the absorption electrode on the auxiliary electrode.

While one or more embodiments of the present disclosure has been described in connection with what is presently considered to be practical exemplary embodiments, it is to be understood that the embodiments are not limited to the disclosed exemplary embodiments and is intended to cover various modifications and equivalent arrangements included within the spirit and scope of the appended claims.

What is claimed is:

1. An organic light emitting diode display comprising:
a substrate;
a first electrode and an auxiliary electrode positioned on the substrate and separated from each other;
an absorption electrode positioned on the auxiliary electrode;
an organic emission layer positioned on the first electrode and having a contact hole exposing the auxiliary electrode and the absorption electrode; and
a second electrode positioned on the organic emission layer and connected to the auxiliary electrode and the absorption electrode through the contact hole;
wherein the second electrode contacts an etched surface of the contact hole, an upper surface of the auxiliary electrode, and an upper surface and a side surface of the absorption electrode.

2. The organic light emitting diode display of claim 1, wherein
the absorption electrode is made of one selected from molybdenum (Mo), titanium (Ti), tungsten (W), and chromium (Cr).

3. The organic light emitting diode display of claim 2, wherein
the absorption electrode is formed of a single layer or multiple layers.

4. The organic light emitting diode display of claim 3, wherein
when the absorption electrode is formed of a single layer, the absorption electrode has a thickness of 300-1500 Å.

5. The organic light emitting diode display of claim 3, wherein
an oxide layer is further formed between the absorption electrode of the multiple layers when the absorption electrode is formed of multiple layers.

6. The organic light emitting diode display of claim 5, wherein
the absorption electrode is formed of dual layers, and
an upper layer and a lower layer of the absorption electrode respectively have thicknesses of 40-100 Å and 300-1000 Å.

7. The organic light emitting diode display of claim 5, wherein
the oxide layer is ITO or IZO.

8. The organic light emitting diode display of claim 1, wherein
the absorption electrode is formed with a line shape or a dot shape in a direction parallel to the auxiliary electrode on the auxiliary electrode.

9. An organic light emitting diode display comprising:
a substrate;
a first electrode and an auxiliary electrode positioned on the substrate and separated from each other;
an absorption electrode positioned on the auxiliary electrode;
an organic emission layer positioned on the first electrode and having a contact hole exposing the auxiliary electrode and the absorption electrode;
a second electrode positioned on the organic emission layer and connected to the auxiliary electrode and the absorption electrode through the contact hole
a gate line positioned on the substrate;
a data line and a driving voltage line insulated from and intersecting the gate line and separated from each other;
a switching thin film transistor connected to the gate line and the data line; and
a driving thin film transistor connected to the switching thin film transistor and the driving voltage line,
wherein the first electrode is connected to a drain electrode of the driving thin film transistor.

10. An organic light emitting diode display comprising:
a substrate;
a first electrode and an absorption electrode made of one selected from molybdenum (Mo), titanium (Ti), tungsten (W), and chromium (Cr), positioned on the substrate and separated from each other;
an organic emission layer positioned on the first electrode and a contact hole exposing the absorption electrode;
a second electrode positioned on the organic emission layer and connected to the absorption electrode through the contact hole,
wherein the absorption electrode is connected to the second electrode thereby having a function of an auxiliary electrode of the first electrode;
a gate line positioned on the substrate;
a data line and a driving voltage line insulated from and intersecting the gate line and separated from each other;
a switching thin film transistor connected to the gate line and the data line; and
a driving thin film transistor connected to the switching thin film transistor and the driving voltage line,
wherein the first electrode is connected to a drain electrode of the driving thin film transistor.

11. The organic light emitting diode display of claim 9, wherein
the absorption electrode is formed of a single layer or multiple layers.

12. The organic light emitting diode display of claim 11, wherein
when the absorption electrode is formed of a single layer, the absorption electrode has a thickness of 300-1500 Å.

13. The organic light emitting diode display of claim 11, wherein
an oxide layer is further formed between the absorption electrode of the multiple layers when the absorption electrode is formed of multiple layers.

14. The organic light emitting diode display of claim 10, wherein
the absorption electrode is formed of a single layer or multiple layers.

15. The organic light emitting diode display of claim 14, wherein
when the absorption electrode is formed of a single layer, the absorption electrode has a thickness of 300-1500 Å.

16. The organic light emitting diode display of claim 14, wherein
an oxide layer is further formed between the absorption electrode of the multiple layers when the absorption electrode is formed of multiple layers.

17. The organic light emitting diode display of claim 16, wherein
the absorption electrode is formed of dual layers, and
an upper layer and a lower layer of the absorption electrode respectively have thicknesses of 40-100 Å and 300-1000 Å.

* * * * *